United States Patent
Marx et al.

(10) Patent No.: US 7,031,421 B2
(45) Date of Patent: Apr. 18, 2006

(54) METHOD AND DEVICE FOR INITIALIZING AN ASYNCHRONOUS LATCH CHAIN

(75) Inventors: Thilo Marx, Villngen-Schwenningen (DE); Peter Schrögmeier, München (DE)

(73) Assignee: Infineon Technologies AG, Munich (DE)

(*) Notice: Subject to any disclaimer, the term of this patent is extended or adjusted under 35 U.S.C. 154(b) by 855 days.

(21) Appl. No.: 10/135,686

(22) Filed: Apr. 30, 2002

(65) Prior Publication Data

US 2002/0176447 A1    Nov. 28, 2002

(30) Foreign Application Priority Data

Apr. 30, 2001   (DE)   ................. 101 21 165

(51) Int. Cl.
   *H03D 3/24*   (2006.01)
   *H04L 7/00*   (2006.01)

(52) U.S. Cl. ....................... 375/376; 375/354

(58) Field of Classification Search ............. 375/376, 375/354, 373, 316; 365/194, 233; 327/158, 327/161, 151
   See application file for complete search history.

(56) References Cited

U.S. PATENT DOCUMENTS

| 5,748,018 | A |   | 5/1998  | Ishikawa        |         |
|-----------|---|---|---------|-----------------|---------|
| 5,764,712 | A |   | 6/1998  | Branstad et al. |         |
| 5,764,714 | A |   | 6/1998  | Stansell et al. |         |
| 5,835,444 | A | * | 11/1998 | Kim et al.      | 365/233 |
| 5,935,257 | A |   | 8/1999  | Nishimura       |         |
| 6,185,150 | B1|   | 2/2001  | Toda et al.     |         |
| 6,489,822 | B1| * | 12/2002 | Han             | 327/158 |

FOREIGN PATENT DOCUMENTS

| CA | 2302020     | 3/1999  |
| DE | 197 37 589 C1 | 11/1998 |
| WO | 99/28806    | 6/1999  |
| WO | 99/50852    | 10/1999 |
| WO | 99/52213    | 10/1999 |

\* cited by examiner

*Primary Examiner*—Khai Tran
(74) *Attorney, Agent, or Firm*—Laurence A. Greenberg; Werner H. Stemer; Ralph E. Locher (57) ABSTRACT

A Method for initializing an asynchronous latch chain is described, wherein data are taken over through a latch stage at the beginning of the latch chain upon a request signal, the method comprising starting of a clock creation means, like for example a DLL (DLL=delay locket loop), for creating an internal clock on the basis of an external clock, resetting the asynchronous latch chain and applying a start signal to a request signal generation circuit whereupon the creation of a first request signal is enabled on the basis of the internal clock after the clock creation means is settled and after the asynchronous latch chain is reset.

12 Claims, 6 Drawing Sheets

METHOD AND DEVICE FOR INITIALIZING AN ASYNCHRONOUS LATCH CHAIN

BACKGROUND OF THE INVENTION

1. Field of the Invention

The present invention relates to initialising asynchronous latch chains as they occur for example with a DDR-(double data rate), a DDR2-RAM or another asynchronous RAM.

2. Description of Prior Art

Since the beginning of digital circuit technology the synchronous circuit design has gained priority over the asynchronous circuit design, for which especially the rapid development in microprocessor technology is responsible, which is based on synchronous circuit technology. Synchronous circuits work like a clocked finite states machine, wherein the states of the logical gates change synchronously and/or always at the same time. Synchronous circuitries are consequently known for a simple circuit design and a test of the design is reduced to a test of the delays of the combinatorial logical functions between the respective registers of the synchronous circuit.

In recent times it has been found, however, that the synchronous circuit design reaches fundamental boundaries, which cannot be solved using synchronous clocking. A first problem is that a circuit can only work synchronously if all its members maintain the clock at least up to a certain degree at the same time. The clock signals are however electrical signals and subject to the same delays as other signals when they spread over wires. If the delay amounts to a significant part of a clock cycle period for a certain part of the circuit, this part of the circuit cannot be regarded as working synchronously with the other parts of the circuit any more.

This problem is especially underlined by the fact that the complexity of circuitries of today's integrated circuits continuously increases, whereby the length of the electric signal paths between different circuit parts is increased.

A further problem of synchronous circuit design lies in the development of heat. With the CMOS-technology the gates for example merely consume energy during switching. As, however, the whole circuit is clocked by a single clock there are many gates, merely switching as they are connected to the clock but not because they process data. Consequently also currently inactive circuit portions consume energy with the synchronous circuits design, which is a disadvantage especially with multi-functional circuits.

The problem of a global clock is solved by an asynchronous circuit design wherein data are not processed by a global clock. Among the different approaches for realising an asynchronous clocking there exists for example one wherein data are transferred via so-called micro-pipelines and thereby captured by latch controllers at different points within the chip and stored temporarily to be released only if the next latch controller stage for receiving data is ready. This way asynchronous latch chains are formed with data being passed on using an acknowledge protocol.

At the beginning of an asynchronous latch chain an internal clock must be produced for taking over data from an external clock for data to be accepted. This clock generation, taking place during initialising the asynchronous latch chain, for example occurs during the circuit switch-on process and is critical for a safe later operation of the asynchronous latch chain.

SUMMARY OF THE INVENTION

It is the object of the present invention to provide a method and a device for initialising an asynchronous latch chain for safe operation.

In accordance with a first aspect of the invention this object is achieved by a method for initialising an asynchronous latch chain, wherein data are taken over at the beginning of the latch chain upon a request signal by a latch stage, including starting a clock creating means like e.g. a DLL (DLL delay locked loop) for creating an internal clock on the basis of an external clock, resetting the asynchronous latch chain and applying a start signal to a request signal generation circuit upon which the creation of a first request signal is enabled on the basis of an internal clock after the clock creation means is settled and after the asynchronous latch chain is reset.

In accordance with a second aspect of the invention this object is achieved by a device according to the invention for initialising an asynchronous latch chain wherein data are taken over upon a request signal by a latch stage at the beginning of the latch chain, the device including a means for starting a clock generation means for creating an internal clock on the basis of an external clock and a means for resetting the asynchronous latch chain. Further, a request signal generation circuit is provided, responding to a start signal in order to enable a first request signal to be created on the basis of the internal clock. A means for applying the start signals applies the start signal to the request signal generation circuit after the clock generation means is settled and after the asynchronous latch chain is reset.

The present invention is based on the finding that a clock created by a clock creation means can be used for generating an internal clock for taking over data at the beginning of an asynchronous latch chain if suitable precautions are taken to prevent an undefined operation of the asynchronous latch chain. For this purpose a start signal is used according to the invention which is applied to a request signal generation circuit only after the clock generating means is settled and after the asynchronous latch chain is reset. Only then does the request signal generation circuit create a first request signal on the basis of the internal clock from the clock generating means in order to start taking over data into the asynchronous latch chain whereby the asynchronous latch chain is prevented from entering undefined or false states.

The clock creation means that needs a certain period or settling time to create a stable clock may for example be a DLL or a PLL.

According to a certain embodiment the start signal is a trailing edge of a start pulse, the resetting of the asynchronous latch chain being started upon the occurrence of a leading edge of this start pulse. Hereby it is ensured that the creation of a request signal is only enabled when resetting the asynchronous latch chain has taken place. A signal defining the start pulse is normally for example located in a logical high state and is temporarily converted into a logical low state for resetting the asynchronous latch chain to then return to the logical high state for starting the request signal generation, so that the leading edge is a falling edge and the trailing edge is a rising edge.

BRIEF DESCRIPTION OF THE DRAWINGS

Preferred embodiments of the present invention are hereinafter described in more detail referring to the accompanying drawings, in which.

DESCRIPTION OF PREFERRED EMBODIMENTS OF THE INVENTION

Referring to the subsequent detailed description it is noted that although the present invention is hereinafter described using an asynchronous latch chain with a four-phase bundled data protocol, the present invention may also be used with asynchronous latch chains comprising other acknowledge protocols, wherein data to be processed are driven forward along the asynchronous latch chain using request and acknowledge signals. In particular, the present invention can further be used with asynchronous latch chains using a two-phase protocol.

Figure 1:
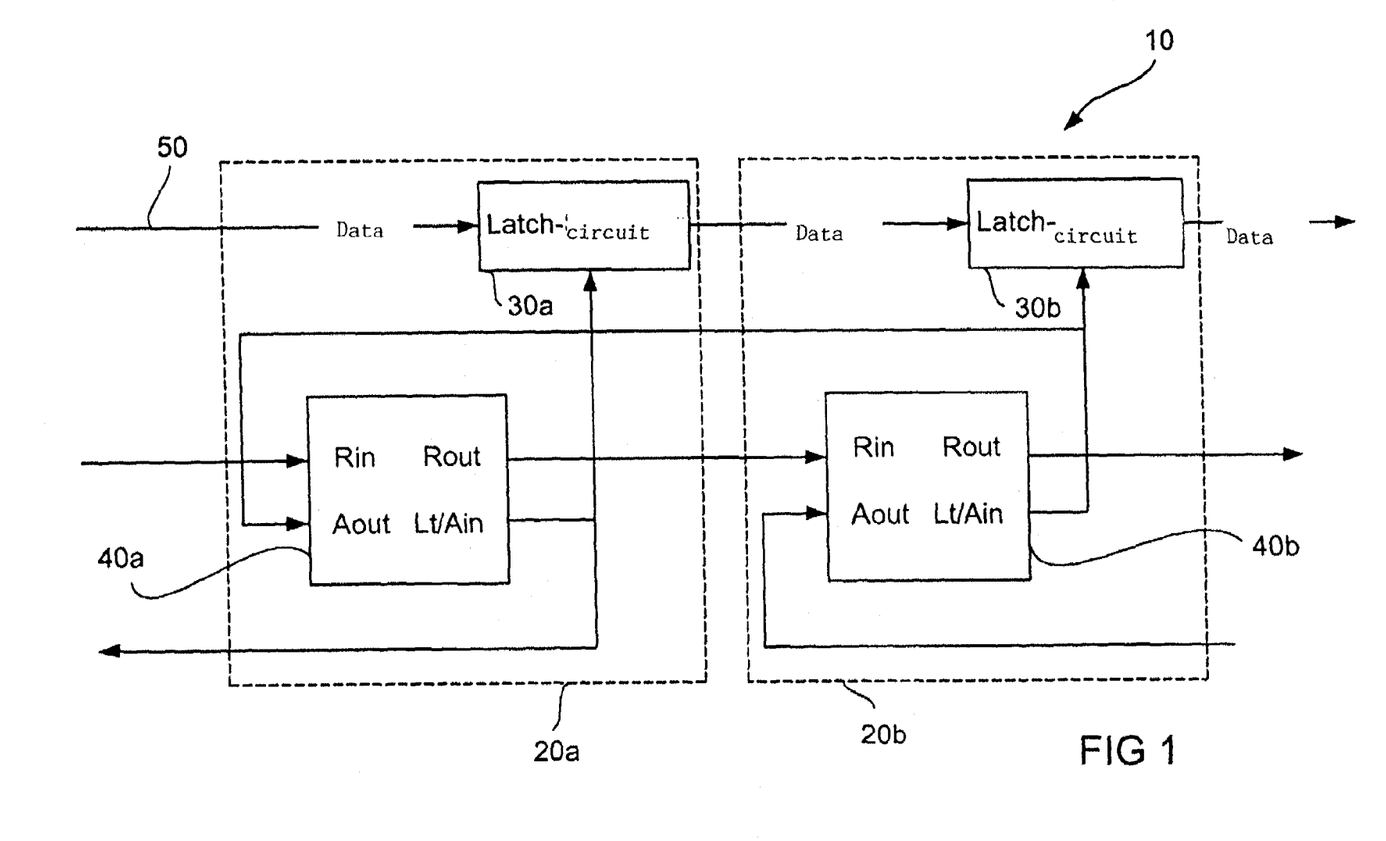
FIG. 1 shows a block circuit diagram of an asynchronous latch chain using a four-phase bundled data protocol.
Figure 2:
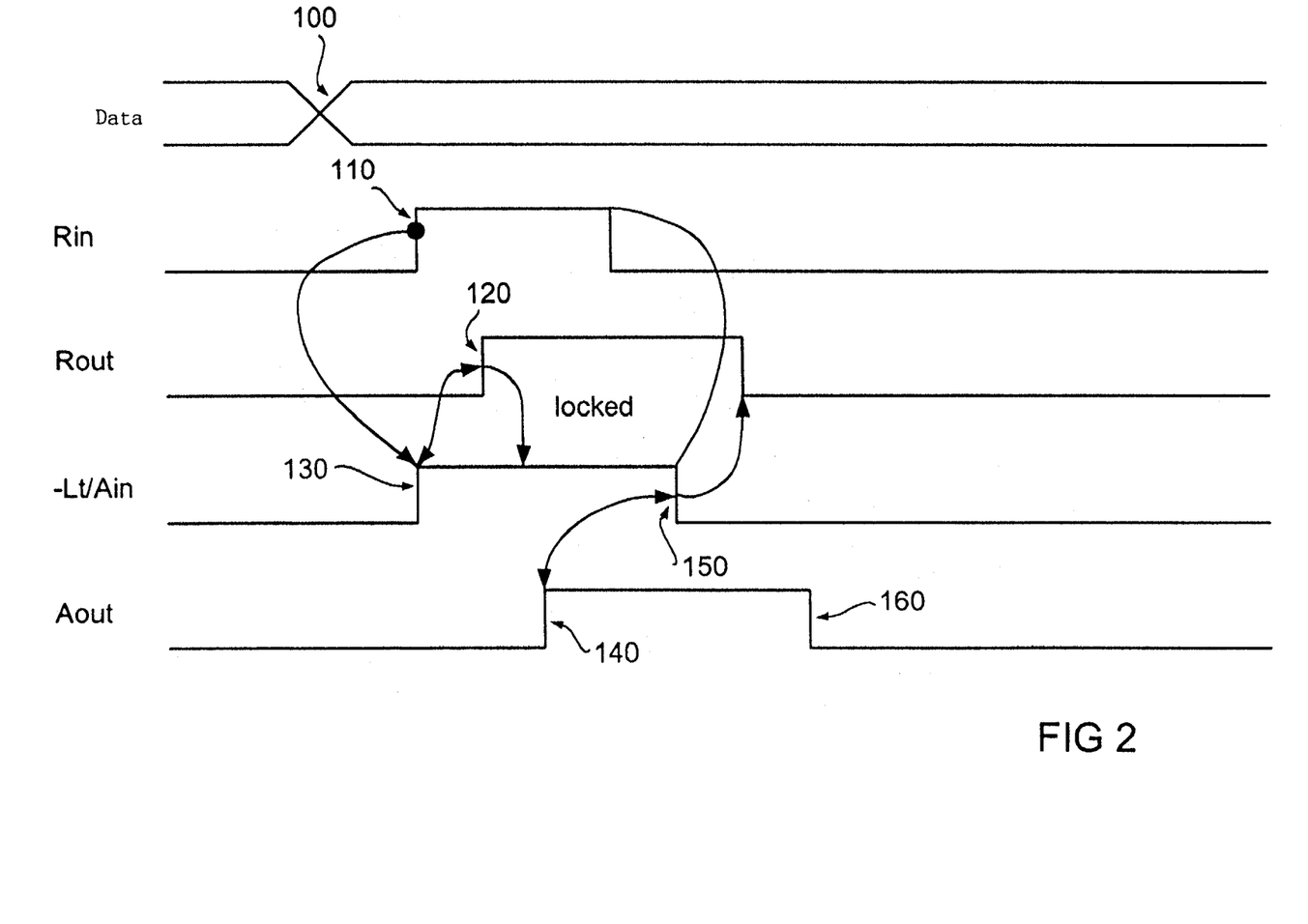
FIG. 2 shows waveforms occurring in the asynchronous latch chain of FIG. 1 for illustrating the four-phase acknowledge protocol.

First referring to FIGS. 1 and 2 the asynchronous circuit technology is explained, that is in particular exemplary using asynchronous latch chains with a four-phase bundled data protocol. FIG. 1 shows part of an asynchronous latch chain being generally shown at 10, wherein two latch stages 20a and 20b are contained in the indicated part. Each latch stage 20a and 20b contains a latch circuit 30a and/or 30b and a four-phase control circuit 4a and/or 4b for controlling the latch circuit 30a and/or 30b. The latch circuits 30a and 30b of the latch stages 20a and 20b are connected in series at the different positions across the chip containing the asynchronous latch chain 10 in a data path 50, so that an output of the latch circuit 30a is connected to the input of the subsequent latch circuit 30b. Data path 50 can be serial or parallel and consist of one or several data lines and in between the latch circuits of a different number of data lines, like for example but not exclusively of one data line for each bit, wherein the latch stages in the latter case may for example be implemented as serializers or de-serializers but also as any other data processing circuit.

Each of the latch circuits 30a and/or 30b consisting of one or more latches is connected to a control output Lt/Ain of the four-phase control circuit 40a and/or 40b via a control input. The output Lt/Ain of each control circuit 40a and/or 40b is further connected to a control input Aout of the control circuit of the correspondingly preceding latch stage, like for example the output Lt/Ain of the control circuit 40b to the input Aout of control circuit 40a. Additionally each control circuit 40a, 40b comprises a further input Rin and a further output Rouc, the output Rout always being connected to the input Rin of the control circuit of the subsequent latch stage, like for example output Rout of control circuit 40a to input Rin of control circuit 40b.

Subsequently the functioning of the asynchronous latch chain shown in FIG. 1 and its four-phase protocol is described with the asynchronous latch chain being mounted in a chip, like for example a DDR-RAM chip. The data flow via data path 50 across the chip is controlled by the asynchronous latch stages 20a, 20b by capturing and buffering data at different positions of the chip in order to time the steering of data across the chip and to provide a temporary storage of data while the data are serialised or de-serialised/parallelised for data output and/or input. In a DDR chip the data to be written with write commands would be de-serialized after the receiver circuit and then be written at the read-write amplifier. In the direction of reading data would be read at the read-write amplifier and be serialised before the off-chip and/or output driver. In parallel to the shown data flow control circuit arrangement a synchronous control circuit arrangement is provided offering a stable timing environment for serialising and de-serializing data.

For controlling the data path, the subsequently described four-phase bundled data protocol is used, wherein two input signals and two output signals are respectively exchanged between the control circuits 40a, 40b, subsequently named after the inputs and/or outputs of the control circuits 40a, 40b from which they are output and/or in which they are input. An output signal Rout is output by a control circuit 40a, 40b to prompt the control circuit of the next latch stage in the latch chain 10 and/or pipeline to capture data stored in the latch circuit of the requesting latch stage on data path 50. A control and acknowledge output signal Lt/Ain is output by a latch stage to the control circuit of the preceding latch stage and to the latch circuit of said latch stage to put the latch circuit into a state wherein it captures and/or buffers said data on data path 50 and to acknowledge to the preceding latch stage that the data scheduled by said output signal Rout were received. The output signals Rout and Lt/Ain reach the subsequent and/or preceding latch stage as input signal Rin and/or Aout. The input signal Rin acts as a request in the subsequent latch stage, so that the incoming data are captured and/or buffered by the latch circuits on data path 50. The input signal Aout acts as an acknowledge signal in the preceding latch stage from the respectively preceding latch stage in the pipeline confirming to the preceding latch stage that the data passed on were received by the subsequent latch stage.

Referring to FIGS. 1 and 2 the signalling protocol is subsequently described in greater detail, FIG. 2 showing the signal waveforms of the signals Rin, Rout, Lt/Ain and Aout (from top to bottom on top of each other) in their progress in time (aligned vertically to each other from left to right), for example occurring between the latch stages of FIG. 1. In the protocol of FIG. 2 it is assumed that the data latch circuits are opaque and/or in a capturing state when the control signal Lt/Ain is in a logical high state. Consequently, the data are held on the latch stage until the next latch stage in the pipeline signalises, that the transferred data have been received.

The protocol shown in FIG. 2 is a four-phase protocol, used to transfer data across the chip, the data hereby being moved from latch stage to latch stage. At a time 100 valid data are for example available at the latch stage and/or a controller 20a at the data output whereupon it outputs a Rout signal. This signal is received at the subsequent controller 28 at the input Rin, whereupon it again sends a signal Rout to the next controller in the pipeline 120 and thereby captures and/or buffers the bundled data at the latch circuit 30b using the signal Lt/Ain 130. The signal Lt/Ain is fed back to the input Aout at the preceding controller 20a in the pipeline in order to acknowledge 140 the input into the latch circuit 30b of the current controller 20b. Said data are held in the latch circuit 30b until the input signals Aout and Rin at the current controller 20b are asserted and/or de-asserted, which is the case at 150. At this time 150, the latch circuit 30b of the current controller 20b is made opaque in order to allow new data to pass and to be captured and buffered into the next pipeline cycle. A further controller cycle may not occur at the outputs of the current controller 20b until the input signal Aout is de-asserted by the Lt/Ain signal of the subsequent controller, which is the case at 160. In other words, the output signal Rout of the current controller 20b cannot be converted to a logical high state until the input signal Aout and/or the output signal Ain of the subsequent controller are converted into a logical low state, provided the signal Rin and/or the output signal Rout of the preceding controller 20a are converted into a logical high state in order to show that a new pipeline cycle request has occurred.

It is noted again that the diagram shown in FIG. 2 was merely chosen as an example and that other protocols can be used for controlling the transfer of data between the serializers and/or parallel-to-serial converters and the de-serializers and/or serial-to-parallel converters and for any further data path steering requirements across the chip.

As was described referring to FIGS. 1 and 2 said data are passed on and captured and/or buffered via the data path and/or via the asynchronous latch chain using request and acknowledge signals. To initiate this cycle of request and acknowledge signals a first request signal is created at the data source and/or where the data path to be controlled starts. In a DRAM this is for example the case at a receiver circuit or at an output of the cell field of the DRAM. The generation and/or creation of this first request signal is carried out with the clock under the use of which the data at the data source are produced. In a DRAM this would for example be the clock with which the data are taken over at the receiver circuit.

To create the take-over cycle a DLL is used which generates a stable phase shifted internal clock from an external clock, like for example from the clock of a computer wherein the DRAM is mounted. The DLL needs a certain number of cycles, typically 200 clock cycles, until it is settled. Before this the clock created by the DLL at the output of the DLL is not reliable. On the basis of the internal clock created by the DLL consequently no request signal must be created until the DLL is settled, as otherwise the asynchronous chain starts and possibly enters undefined or wrong states, as the signal course of the request signals is directly dependent on the signal course of the internal clock.

Figure 3:
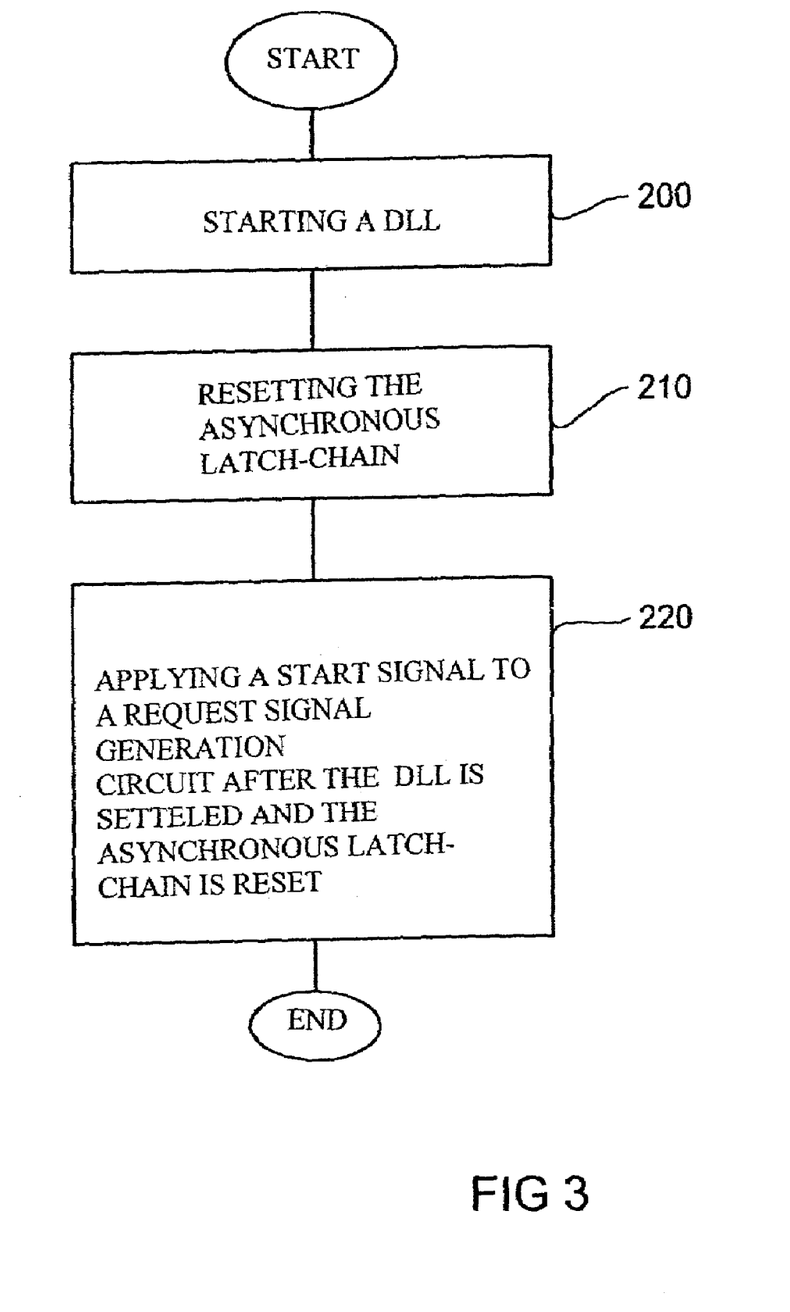
FIG. 3 shows a flow chart showing the steps for initialising an asynchronous latch chain according to the invention.

In FIG. 3 a method according to the present invention is shown enabling the use of a DLL for creating the internal clock using which or based on which the data at the beginning of the asynchronous latch chain are taken over, ensuring that the first request signal is created based on the internal clock only after the DLL is settled and the asynchronous latch chain is reset. This way it is ensured that the internal clock used for creating the request signal is clean and stable and the asynchronous circuits of a chain start from a defined state.

In a first step 200 the DLL is started. In case the asynchronous latch chain is part of a DRAM this for example occurs when switching on the computer containing the DRAM or at any other time during the operation of the computer, like for example after the DLL has been switched off after a certain inactivity time limit has passed. In step 210 the different asynchronous latch stages of the asynchronous latch chain are subsequently reset, as is known in the art, for example by biasing the different latch stages using a predetermined voltage in order to reset flip-flops. Resetting the asynchronous latch chain can occur at any time after starting the DLL, like for example simultaneously to starting the DLL or immediately before the DLL is settled.

In step 220 a start signal is subsequently applied to a request signal generation circuit, creating a first request signal on the basis of the internal clock created by a DLL for taking over data into the asynchronous latch chain. In step 220 it is hereby secured that the start signal is only applied to the request signal generation circuit after the DLL is settled and the asynchronous latch chain is reset. The request signal generation circuit, for which an embodiment is described referring to FIGS. 4 and 5, can be edge controlled and state controlled and correspondingly the start signal can either be a state change or a logical state of a signal.

To ensure that the start signal is only applied after the settling of the DLL, for example a power-up circuit, a test mode register or the like can be used, as is known for driving chips.

To additionally ensure that the start signal is only applied after the asynchronous latch chain is reset, the start signal is defined as a trailing edge of a pulse according to the subsequently described embodiment of FIGS. 4 and 5, while the rising edge initiates resetting the asynchronous latch chain of step 210. It would however further be possible to use two signals on two different lines for triggering resetting 210 and applying 220, the earlier signal being independently defined of the line for triggering resetting 210 and the later signal for triggering applying 220.

Referring to FIG. 3 it is further noted that the described method can be implemented by corresponding hardware, firmware or software means carrying out the steps described in the operations.

Subsequently an embodiment of the request signal generation circuit is described referring to FIGS. 4 and 5, wherein a pulse RESETn is used for triggering resetting the asynchronous latch chain and for creating the first request signal on the basis of the internal clock, which is sent to all asynchronous latch stages and which is usually in a logical high state and temporarily changes into a low state. By the driving of the chip, like for example by a power-up circuit or a test mode register, it is ensured that this pulse is only created when the DLL is settled. Initialising and/or resetting of the asynchronous latch stage is carried out using the falling and/or leading edge of the pulse, while creating the request signals is started with the rising, i.e. the trailing edge of the pulse. Hereby it is guaranteed that the request signals are only created, and thereby the asynchronous chain only starts running, when all elements of this chain are reset.

Figure 4:
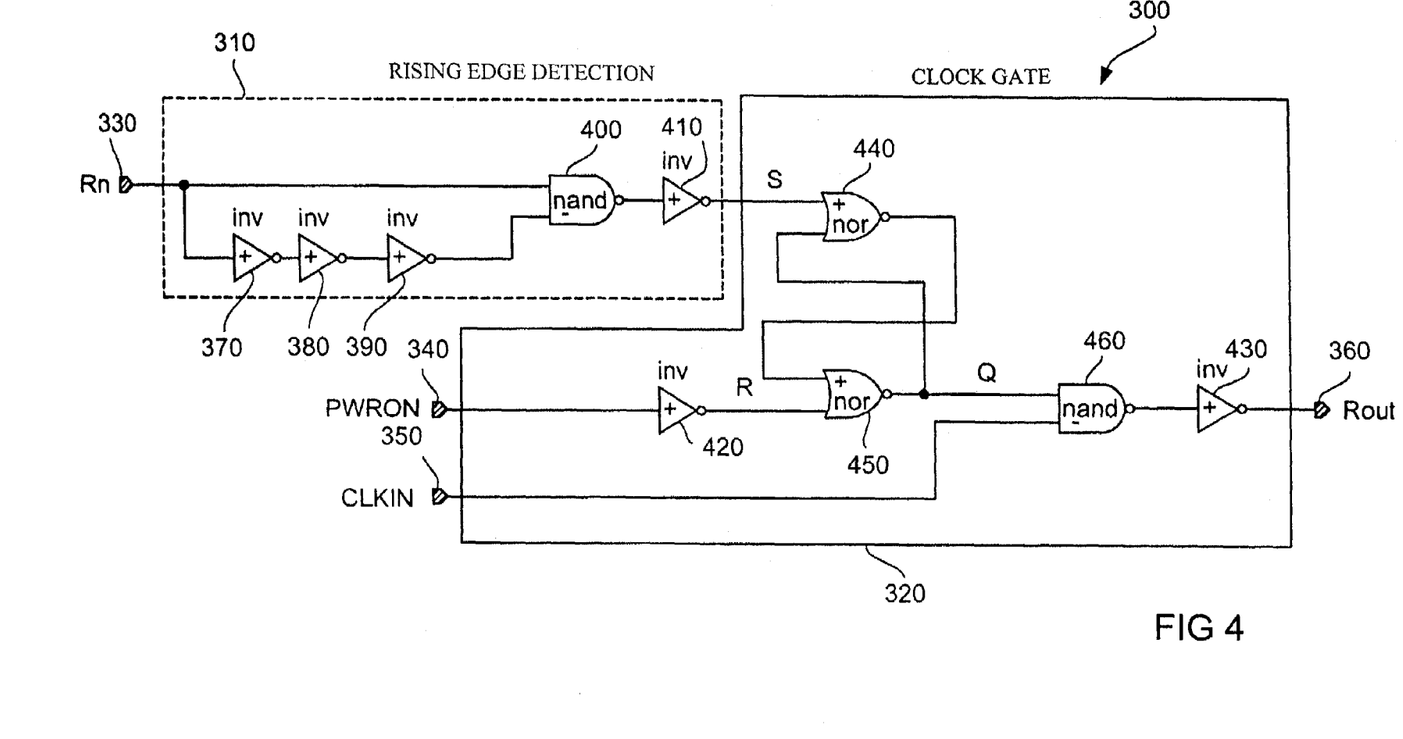
FIG. 4 shows a circuit diagram of a request signal generation circuit according to an embodiment of the present invention.

Referring to FIG. 4 first of all the circuitry of the request signal generation circuit is described according to an embodiment of the present invention. The request signal generation circuit generally shown at 300 mainly consists of a circuit part for rising edge detection 310 and a circuit part 320 functioning as a clock gate. The rising edge detection circuit 310 is connected between an input Rn 330, to which the previously described reset pulse is applied which is hereinafter called the RESETn pulse and sent to all asynchronous latch stages, and the clock gate circuit 320, to detect the rising edge of the RESETn pulse whereupon the creation of the first request signal is to be enabled on the basis of the internal clock of the DLL. The clock gate circuit 320 is connected to an input PWRON 340 of the request signal generation circuit 300 to receive the signal PWRON as the switch-on signal using which it is reset and which also starts the DLL and is further connected to an input 350 CLKIN to which the internal clock CLKIN created by the DLL is applied. As will be described afterwards, the clock gate circuit 320 acts such, that it only outputs the internal clock signal CLKIN at an output Rout of the circuit 300 after the rising edge of the RESETn pulse has been detected.

The rising edge detection circuit 310 includes three inverters 370, 380 and 390 connected in series, one NAND gate 400 and a forth inverter 410. The inverters 370–390 are connected in series between the input Rn 330 and a first input of the NAND gate 400 while the other input of the NAND gate 400 is directly connected to the input 330 Rn. The inverter 410 is connected between the NAND gate 400 and the clock gate circuit 320.

Using the sum of their inverter run times the inverters 370–390 cause the application of an inverted signal time delayed relative to the second input to be applied to the first input of the NAND gate 400. When the RESETn pulse is currently applied to the input Rn 330, i.e. a logical low state over a period of time which is longer than the sum of the inverter run times, a logical high state is applied to the first input of the NAND gate 400 and to its other input a logical low state is applied. If the signal Rn, however, returns to the logical high state after the RESETn pulse, a logical high state is applied to both inputs of the NAND gate 400 for the period of time of the inverter run time sum. The output signal of the NAND gate temporarily changes into a logical low state, which is inverted by the inverter 410 and is output to the clock gate circuit 320 as signal S, whereby the rising and/or trailing edge of the RESETn pulses are signalised. Consequently, the signal S advertises the rising edge of the RESETn pulse with a logical high state.

The clock gate circuit 320 includes two inverters 420, 430, a RS flip-flop formed by two NOR gates 440 and 450, and one NAND gate 460. The inverter 420 is connected between a first input of the NOR gate 450 and the input PWRON 340. An output of the NOR gate 450 is connected to a first input of the NOR gate 440 while an output of the NOR gate 440 is connected to a second input of the NOR gate 450. A second input of the NOR gate 440 is connected to the output of the inverter 410 and/or the rising edge detection circuit 310 to receive the signal S. The output of the NOR gate 450 is connected to the input of the NAND gate 460, whereas a second input of the NAND gate 460 is connected to the input CLKIN 350. The inverter 430 is connected between an output of the NAND gate 460 and the output Rout 360.

Figure 5:
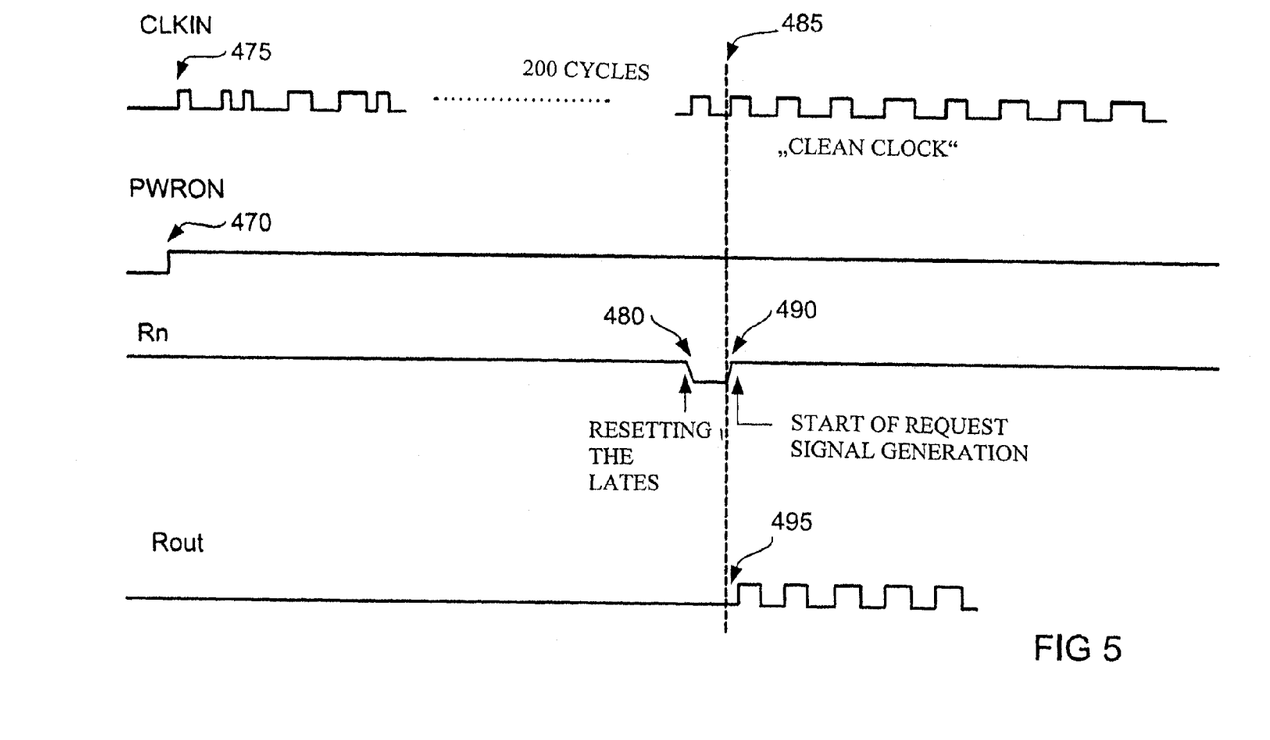
FIG. 5 shows waveforms occurring in the circuit of FIG. 4.

To explain the functioning of the clock gate circuit 320 reference is further made to FIG. 5, wherein exemplary signal waveforms for the signals CLKIN, PWRON, Rn and Rout (from top to bottom) are shown in their progress in time (from left to right). The signal PWRON for example changes at 470 from a logical low to a logical high state during a circuit switch-on process and thereby starts 375 the DLL which creates the internal clock CLKIN, as was mentioned above. The signal PWRON is inverted by the inverter 420 and output invertedly as signal R, whereby the flip-flop consisting of the NOR gates 440 and 450 is reset simultaneously to starting the DLL. The signal Rn defining the RESETn pulse is usually located in a logical high state, as was already mentioned, and only 480 changes temporarily into a logical low state after the DLL has almost reached its settled state and creates a "clean clock", which is the case at time 485.

As was mentioned above, the asynchronous latch chain and/or the asynchronous latch stages are reset using the falling edge 480 of the RESETn pulse. The duration of the RESETn pulse and the time period between the start 475 of the DLL and the falling edge 480 of the RESETn pulse is set such, that its rising edge 490 only occurs when the DLL is settled 485, as is shown by a vertically dotted line in FIG. 5.

The rising edge 490 is detected by the rising edge detection circuit 310, as was mentioned previously, and the clock gate circuit 320 is signalised by the signal S. The signal S sets the flip-flop and causes changing the output signal of the NOR gate 450 and/or the flip-flop Q into a logical high state. Only at that time is it enabled that a first request signal Rout is created 495 on the basis of the clock signal CLKIN to start the asynchronous chain by passing on the clock signal CLKIN through the NAND gate 460 and the inverter 430 to the output 360 Rout which is e.g. connected to the input Rin of the first latch stage of the asynchronous latch chain either directly or via a frequency separator.

Although not shown in the embodiment of FIG. 5, the internal clock CNKIN can either be used directly as a clock for the request signal Rout or, however, a further clock processing means is connected downstream to the output Rout, like for example a frequency divider, a multiplier or anything similar.

Although resetting the request signal generation circuit was triggered simultaneously to starting the DLL by the signal PWRON in the preceding embodiment, both actions can also be carried out at different times and/or be triggered by two different switch-on signals.

In contrast to the above description the components of the circuit of FIG. 4 can also be implemented differently, like for example the NAND gate functioning as switch 460 as a field effect transistor.

Figure 6:
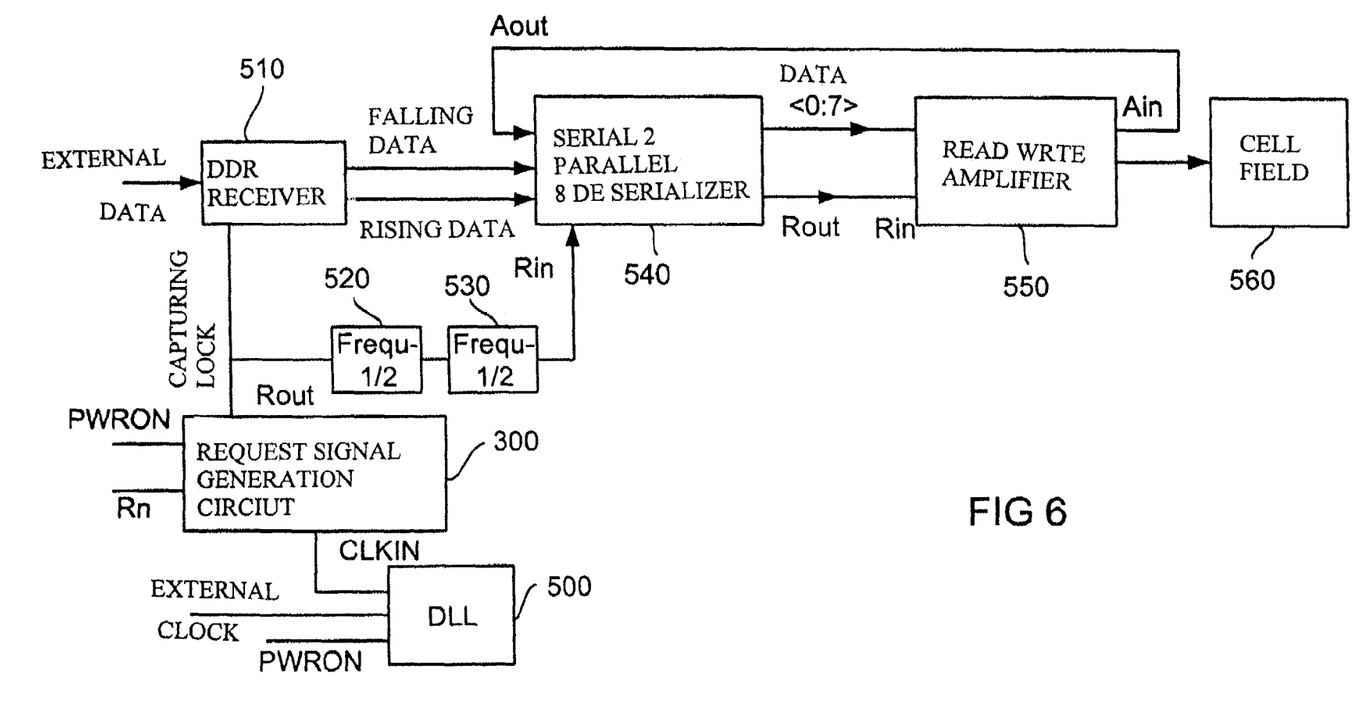
FIG. 6 shows a block circuit diagram of a DDR-RAM, wherein initialising an asynchronous latch chain can be applied according to the invention.

Referring to FIG. 6 an embodiment is subsequently described wherein the request signal generation circuit shown in FIG. 4 is applied in a DDR-RAM. Next to the request signal generation circuit 300 a DLL 500, a DDR receiver 510, two frequency dividers 520 and 530, a serial two parallel eight deserializer 540, i.e. a circuit for converting serial data into parallel data on eight data lines, a read-write amplifier 550 and a cell field 560 are implemented on the chip of the DDR-RAM. The de-serializer 540 and the read-write amplifier 550 form two asynchronous latch stages of an asynchronous latch chain. An output of the DLL 500 is connected to the input CLKIN of the request signal generation circuit 300 and generates from the external clock at the output the internal clock CLKIN from the point on, when it received the signal PWRON at an input.

The output Rout of the request signal generation circuit 300 is connected to an input Rin of the de-serializer 540 and further with a clock input of the DDR receiver 510 via the two frequency dividers 520 and 530 connected in series. The DDR receiver 510 receives the external data at a further input e.g. from a bus (not shown) of a computer and is able to scan the external data at a rising and falling edge of the clock signal and/or capturing clock from the request signal generation circuit 300 and to pass them on to the deserializer 540 on separated lines, i.e. one for "falling data" scanned at the falling edge, and one for "rising data" scanned at the rising edge.

An output Rout of the de-serializer 540 is connected to an input Rin of the read-write amplifier 550 to output a request signal Rout to the read-write amplifier 550. In addition the de-serializer 540 and the read-write amplifier 550 are connected via eight bit lines to pass on data <0:7> from the deserializer 540 to the read-write amplifier 550. An output Ain of the read-write amplifier 550 is connected to an input Aout of the de-serializer 540. A data output of the read-write amplifier 550 is connected to a cell field 560 to drive data into the cell field and/or to read out data.

During normal operation, the DDR receiver 510 receives external data, scans them at the rising and the falling edges of the clock signal of the DLL 500 and outputs the scanned data as falling and rising data on said two lines to the deserializer 540 using the clock of the DLL 500. The deserializer 540 de-serialises the data received from the receiver 510. Part of the de-serializer 540 is a latch circuit controlled asynchronously through the request signal at the input Rin. Since eight data packages from the receiver 510 belonging to four clock cycles of the DLL 500 are to be de-serialised respectively, the capturing clock output from the request signal generation circuit 300 to the output Rout, which is directly passed on from the DLL 500, as described referring to FIG. 4, is divided twice by the frequency dividers 520 and 530 before it is used as a request signal for the de-serializer 540.

According to the four-phase protocol described referring to FIGS. 1 and 2 the de-serializer 540 outputs the captured and buffered data via the eight bit line to the read-write amplifier 550 requested by the asynchronous driving signal Rout of the de-serializer 540 applied to the input Rin to capture and/or buffer and further process the data as soon as capturing and buffering of the data packages in the four clock cycles is completed and valid data are submitted. This way the read-write amplifier 550 e.g. receives a command for writing data into the cell field.

When switching on the computer (not shown) in which the DDR-DRAM is mounted, first of all the DDL 500 is started by the signal PWRON and the request signal generation circuit 300 is reset by resetting the flip-flop (FIG. 4) of the request signal generation circuit 300, as was described referring to FIG. 4. A suitable means ensures that the RESETn pulse is only created then, so that the rising edge of this pulse only occurs when the DDL 500 is settled. With the falling edge of this RESETn pulse the asynchronous latch stages, i.e. the serial two parallel eight de-serializer 540 and the read-write amplifier 550, are reset. Upon the occurrence of the rising edge, the request signal generation circuit 300 enables passing on the clock signal CLKIN to the frequency divider 520 and 530 and/or to the DDR receiver 510 as a capturing clock, as was described above. Hereby it is inherently assured due to providing the RESETn pulse to trigger the resetting of the asynchronous latch stages and to trigger the creation of the capturing clock and/or the request signal that the asynchronous latch chain only starts running when all elements of this chain have been reset, whereby a safe operation of the asynchronous latch chain is ensured.

Consequently it is ensured according to the present invention that the clock created by the DLL is only used for creating the data take-over request signal after the DLL is settled and the asynchronous latch chain is reset.

Referring to FIG. 6 it is noted that the preceding description is merely related to the data path within a RAM. An address path and a command path, however, can likewise be implemented as an asynchronous chain, that is with an address latch for processing memory addresses and/or a command latch or a state machine for processing memory commands as the next processing unit.

Referring to the description above it is noted that also other devices are conceivable instead of a DLL as a clock creation device, like for example a PLL, and that in contrast to the preceding description the asynchronous latch chain can also be based on a protocol different to the four-phase protocol, like for example the two-phase protocol or any other protocols based on request signals. The start signal for triggering the request signal generation circuit can either be a change of state of a signal, i.e. a rising or a falling edge or a logical state itself, i.e. logical high or low, as mentioned above. Further, the asynchronous latch chain can be integrated in chips other than a DDR-RAM, like for example in a controller for carrying out a variety of different functions, as it is for example the case with chip cards with asynchronously working coprocessors.

Referring to a hardware implementation of the request signal generation circuit it is noted, that it must not be integrated in a chip together with the asynchronous latch chain. The asynchronous latch chain and the request signal generation circuit can further be arranged on a printed circuit board or partially be arranged on it.

What is claimed is:

1. A Method for initialising an asynchronous latch chain, wherein data are taken over upon a request signal by a latch stage at the beginning of the latch chain, the method comprising:
   starting a clock creation means for creating an internal clock on the basis of an external clock;
   resetting the asynchronous latch chain;
   applying a start signal to a request signal generation circuit whereupon the creation of a first request signal is enabled on the basis of the internal clock after the clock creation means is settled and after the asynchronous latch chain is reset.

2. The Method of claim 1, wherein the clock creation means is a DLL.

3. The Method of claim 1, wherein the start signal is a trailing edge of the start pulse, the resetting of the asynchronous latch chain occurring upon the occurrence of a leading edge of the start pulse and the creation of the first request signal being enabled upon the occurrence of the trailing edge of the start pulse.

4. The Method of claim 3, wherein the leading edge is a falling edge and the trailing edge is a rising edge.

5. The Method of claim 1, further comprising:
   Resetting a flip-flop of the request signal generation circuit upon a switch-on signal;
   Setting the flip-flop upon the start signal, an output of the flip-flop being connected to a switch enabling the creation of the first request signal when the flip flop is set.

6. A Device for initialising an asynchronous latch chain, wherein the data are being taken over upon a request signal by a latch stage of the beginning of the latch chain, further comprising:
   a means for starting a clock creation means to create an internal clock on the basis of an external clock;
   a means for resetting the asynchronous latch chain;
   a request signal generation circuit responding to a start signal to enable a first request signal to be created on the basis of an internal clock;
   a means for applying a start signal to the request signal generation circuit after the clock creation means is settled and after the asynchronous latch chain is reset.

7. The Device of claim 6, wherein the clock creation means is a DLL.

8. The Device of claim 6, wherein the start signal is a trailing edge of a start pulse, the means responding to the occurrence of a leading edge of the start pulse for resetting the asynchronous latch chain, and the request signal generation circuit responding to the occurrence of the trailing edge of the start pulse.

9. The Device of claim 8, wherein the leading edge is a falling edge and the trailing edge is a rising edge.

10. The Device of claim 6, wherein the request signal generation circuit further comprises:
    a flip-flop;
    a means for resetting the flip-flop;

a means for detecting the start signal and for setting the flip-flop upon detecting the start signal; and a switch including a first input connected to the output of the flip-flop, a second input for receiving the internal clock and an output at which the internal clock signal is output when the flip flop is set.

11. The Device of claim 10, wherein:

the start signal is a trailing edge of the start pulse, wherein the resetting of the asynchronous latch chain takes place upon the occurrence of a leading edge of the start pulse and the creation of the first request signal is enabled upon the occurrence of the trailing edge of the start pulse;

the leading edge is a falling edge and the trailing edge is a rising edge; and the means for detecting the start signal for setting the flip-flop comprises the following:

a means for delaying and inverting the start signal having an input for receiving the start signal and an output;

a comparing means having a first input connected to the output of the means for delaying and inverting and a second input for receiving the start signal and an output connected to the input for setting the flip flop.

12. The Device of 6, wherein the means for applying the start signal further comprises:

a means for ensuring that the start signal is only applied after the clock creation means is settled.

* * * * *